US011340668B2

(12) United States Patent
Brooks et al.

(10) Patent No.: US 11,340,668 B2
(45) Date of Patent: May 24, 2022

(54) CABLELESS POWER AND DATA COMMUNICATION BUS FOR DIGITAL DISPLAYS

(71) Applicant: Anthem Displays, LLC, Boulder, CO (US)

(72) Inventors: Evan D. Brooks, Boulder, CO (US); Timothy J. VanderMey, Orlando, FL (US)

(73) Assignee: ANTHEM DISPLAYS, LLC, Boulder, CO (US)

( * ) Notice: Subject to any disclaimer, the term of this patent is extended or adjusted under 35 U.S.C. 154(b) by 0 days.

(21) Appl. No.: 17/107,935

(22) Filed: Nov. 30, 2020

(65) Prior Publication Data
US 2021/0165470 A1 Jun. 3, 2021

Related U.S. Application Data

(60) Provisional application No. 62/941,972, filed on Nov. 29, 2019.

(51) Int. Cl.
| | |
|---|---|
| *G09G 5/00* | (2006.01) |
| *G06F 1/18* | (2006.01) |
| *G09G 3/32* | (2016.01) |
| *G06F 1/20* | (2006.01) |
| *G09F 9/302* | (2006.01) |
| *H05K 7/20* | (2006.01) |

(52) U.S. Cl.
CPC .............. *G06F 1/189* (2013.01); *G06F 1/20* (2013.01); *G09F 9/3026* (2013.01); *G09G 3/32* (2013.01); *H05K 7/20963* (2013.01); *G09G 2300/026* (2013.01); *G09G 2330/02* (2013.01); *G09G 2370/16* (2013.01)

(58) Field of Classification Search
CPC .......... G06F 1/189; G06F 1/20; G09F 9/3026; G09G 3/32; G09G 2300/026; G09G 2330/02; G09G 2370/16; H05K 7/20963
USPC ....................................................... 345/1.1
See application file for complete search history.

(56) References Cited

U.S. PATENT DOCUMENTS

| | | | | |
|---|---|---|---|---|
| 2011/0181495 | A1* | 7/2011 | Chu ......................... | G09F 9/33 345/1.3 |
| 2014/0003052 | A1* | 1/2014 | Hemiller ................. | F21V 21/34 362/249.02 |
| 2017/0345363 | A1* | 11/2017 | Brooks ..................... | G09G 3/32 |
| 2018/0031919 | A1* | 2/2018 | Ryu ........................ | H01F 7/0252 |
| 2020/0022270 | A1* | 1/2020 | Mori .................... | H05K 5/0208 |

* cited by examiner

*Primary Examiner* — Jennifer T Nguyen
(74) *Attorney, Agent, or Firm* — Sheridan Ross P.C.

(57) ABSTRACT

A connection scheme for LED display array is disclosed. The array includes a plurality of LED modules having LEDs on the front surface and a rear surface having connection points optionally surrounded by a compressible weather seal. The connection points of the LED module electrically connect to a power bus for receiving both power and data. Alternatively, power and data signals may be provided separately through separate means. When the LED modules are attached to a support structure for the display array, the connection points electrically connect with the bus or buses. Mechanical locking features may be used to create a compressing force to facilitate the electrical connection or interface between the LED module connection points and the bus or buses.

19 Claims, 19 Drawing Sheets

CABLELESS POWER AND DATA COMMUNICATION BUS FOR DIGITAL DISPLAYS

CROSS-REFERENCE TO RELATED APPLICATIONS

This application claims the benefit of U.S. Provisional Patent Application Ser. No. 62/941,972, filed Nov. 29, 2019, the entire disclosure of which is hereby incorporated herein by reference for all that it teaches and for all purposes.

FIELD

The present disclosure relates to cableless power and data communication architecture for modular digital displays.

BACKGROUND

Current methods for connecting power and data to LED display modules typically consist of cabling and connectors. State of the art digital LED arrays utilize many LED modules and often include hundreds or even thousands of connectors and cables interconnecting the individual modules into an overall array or display. Given the large quantity of connectors and cables, a high probability of failure exists. In addition, many digital LED displays are located outdoors and are subject to a variety of weather conditions, including rain, snow, high humidity and wind. To counteract such adverse weather conditions, cabinets or enclosures are provided to encase several individual LED modules. Such cabinets or enclosures add cost, bulk and weight to an overall digital display.

Current methods of connection largely include pin and barrel connectors. A conductive pin located at the end of a cable is inserted into a conductive barrel to provide an electrical connection. With these types of connections there is a relatively small contact surface area between the pin and barrel for electrical current to pass through. Because corrosion may occur at the connection point, over time the transmission of power through the connection interface is reduced and ultimately the operation of the LED module is compromised and may even fail. Even though electricity may pass through a corroded connector, eventually the connection may degrade to the point that the display malfunctions. All things being equal, corrosion at a connection interface with a small surface area, such as with a pin and barrel connector, may cause a performance degradation more quickly than a connector with a larger contact surface area.

Accordingly, there is a need for improved LED modules with reduced cabling, improved electrical connections and enhanced weather resistance for the electrical connections.

SUMMARY

In accordance with aspects of the present disclosure, a cableless power and data connection scheme with improved connectors for LED modules is disclosed. Reducing the number of cables and improving electrical connections increases the operating life of an LED display and reduces costs of construction, assembly and installation, as well as subsequent maintenance and service.

In accordance with other aspects of the present disclosure, an LED module having weather resistant electrical connections or contact points is disclosed. The disclosed power and data connection schemes provide a simple, weather resistant method for connecting LED modules to their power and data buses or distribution lines. Using weather resistant architecture consistent with the present disclosure also increases the operating life of LED modules, reduces system weight, bulk, component cost, and installation and removal labor costs while also reducing the requirements of the mechanical structure.

Because the power and data connections are resistant to the effects of weather, an enclosure or cabinet to protect the electrical connections from adverse environmental conditions is no longer required, as it is with typical state of the art displays. Eliminating the need for an enclosure allows for simplification and cost reduction of the display's mechanical structure and opens possibilities for a wide variety of efficient mechanical frame architectures previously not possible without the use of expensive fully sealed cables and connectors.

In one embodiment, an individual display module has a front face containing LEDs and a rear face having at least two weather resistant connection points. Preferably, there is a mechanical connection point proximate each of the four corners of the module for physically connecting the module to a mounting structure. A support beam is illustrated herein as one type of mounting structure; however, it should be appreciated that there is a large variety of mounting architectures that may be used in connection with LED displays. The embodiments of the present disclosure disclosed herein are not limited to any specific mounting or support structure but may be utilized with virtually any skeletal frame or supporting architecture.

In one embodiment, a positive power conductor or bus and a negative power conductor or bus extend along a support structure and electrically connect with one or more LED modules. The buses may be located in close proximity to each other or may be separated. The connectors or contact points on the LED modules are located as needed to engage the buses. In one embodiment a positive and a negative bus are located to engage contacts on opposite sides of each display module. The buses may be enclosed such that they are sealed from the environment, or they may be exposed to the environment. The buses may run vertically interconnecting a column of modules or horizontally interconnecting a row of modules. Preferably, the buses are attached to the support structure and run with the support structure. Other bus architectures may occur to those of skill in the art upon review of the present disclosure and are deemed within the scope of the present disclosure.

In this same embodiment, an LED module contacts each power bus at connection points such that an electrical current flows between the positive bus and the negative bus, across internal circuitry of the module. In this embodiment, the connection points comprise a compressible spring contact made of an electrical conductor, preferably a beryllium-copper alloy, plated steel or other suitable material. Optionally, the connectors are surrounded by a compressible weather resistant seal. When the module is attached to the supporting structure, the seal is compressed and the electrical spring contact is simultaneously compressed into engagement with the power bus. The compressed seal then creates a weather resistant barrier around the connection point.

In this embodiment, data is provided to the module through the power connection. An encoded signal is modulated and superimposed on the voltage which is then decoded at the module. The module receives the signal through the connection of the compressed spring connector and the power bus conductor. The signal is then used to operate the display module.

There may be two or more connection points on each module. As previously noted, one connection point interfaces with the positive bus and one connection point interfaces with the negative bus. In a preferred embodiment there are four connection points. The third and fourth connection points provide redundancy should either or both of the first two connection points fail thereby enhancing the operating life of the module. The connection points may be located as architecturally permitted but are preferably located proximate each corner of the rear face of the module.

The signal is provided to the module through a controller associated with the display. There may be a single controller for the entire array or display or there may be multiple controllers. For example, there may be a secondary controller associated with each row or groups of rows or with each column or groups of columns of modules and each secondary controller is, in turn, connected with a master controller.

According to other aspects of the present disclosure, a contact plate is used as an interface between the buses and the contact points of a module. This embodiment is similar to the previously described embodiment in terms of the module hardware and the method of data and power transmission. However, the connection between the contact point and the power bus is provided through a contact plate rather than direct contact between the module contact points and the power bus.

The contact plate comprises a plate having at least two contact pads, one electrically connected to the positive bus (the positive contact) and one electrically connected to the negative bus (the negative contact). The contact plate is comprised of a printed circuit board (PCB) that has conductive traces creating electrical pathways between contact pads. The traces or pathways may be internal or external to the PCB. For example, the contact pads may be positioned on one surface of the PCB and the traces positioned on the opposite surface or internal to the PCB and interconnected through vias in the PCB. Alternatively, the contact pads and traces may be co-located on the same surface of the PCB. In this latter case, vias or other through connectors would be needed to electrically connect with the buses. If located on the exterior of the contact plate, the pathways would be covered with a solder mask or similar coating. The contact plate is typically rectilinear but can be other shapes. Each contact pad is an exposed portion of the copper circuit of the PCB, and can be plated with tin, nickel, gold, or silver or other suitable surface PCB surface finish. For system longevity and redundancy, each contact plate may include four contact pads, two associated with the positive bus and two associated with the negative bus.

The contact plate is configured to mount to the display support structure. This may be performed through mechanical fasteners, adhesives or other techniques known in the art. According to aspects of the present disclosure, the contact plate may be oriented parallel to the power bus and may be oriented such that electrical current flows across it in either the vertical or horizontal direction. Alternatively, the contact plate may be clamped between the support structure and the seal by a force provided by the locking feature of the display module.

Depending upon the location of an individual LED module in an overall array, the individual module may interface with one to four contact plates. In one embodiment, a contact plate is configured and oriented such that one module connects with the positive and negative buses through a single contact plate. In another embodiment, one LED module may connect with a positive bus through one contact plate and interface with a negative bus through a second contact plate. If redundancy is built into the system architecture, a single LED module may interface with four contact plates where two of the contact plates provide an interface to a positive bus and two of the contact plates provide an interface to a negative bus. The architecture of the contact plates corresponds to the location of the contact plate relative to the position of the LED modules in an overall display. Contact plates that interface with LED modules on an exterior edge of a display may have different architectural requirements compared to contact plates that interface with LED modules at an interior location of a display. The flexible configurations provided by the contact plates of the present disclosure accommodate LED module location requirements.

According to aspects of the present disclosure, in other embodiments, the contact plate may contain data connection pads in addition to and separate from power contact pads. These embodiments are similar to the previous embodiment which includes a connector plate, however additional circuitry is provided to accommodate a separate data transmission pathway.

In these embodiments, a separate data bus or transmission line is provided rather than overlaying data on the power bus. In addition to a power contact pad, the contact plate includes at least one separate data or signal contact pad. In at least one embodiment, the data contact pad is located proximal the power contact pad, although this location is not required. The signal or data contact pad is similar to the power contact pad in construction and is an exposed portion of the printed copper circuit, and can be plated with tin, nickel, gold, silver, or another suitable surface finish. The contact pad is in electrical communication with the separate data bus such that when a connection is made between the data contact of the LED module and the data contact pad of the contact plate, the LED module is able to receive and send a data signal from and to a controller via the data contact pad of the contact plate. Further, as discussed above regarding the contact plate, electrical pathways or traces are provided external to or internal to the contact plate that allow the contact plate to receive an electrical signal from the data bus at one connection point and then transmit the signal to the data bus at a second connection point, for example when the data signal is intended for a different LED module.

The LED module of this embodiment is similar to the LED module of the previously described embodiment except that at least one of the connection points includes at least one data contact. According to aspects of the present disclosure, the data contact or data contact point of the LED module is similar in construction to the power contact point of the previously described embodiments and consists of a compressible spring conductor. In one embodiment, the spring conductor is formed from a thin sheet of conductive material, preferably a beryllium-copper alloy, plated steel or other appropriate conductive material, that has been bowed outwards away from the rear face of the display module like a leaf spring. There may be one or more of the data contacts, but preferably there are three. The three connections allow for a positive, negative, and a ground connection. This architecture supports, for example, an RS-485 communication protocol. Other connector architectures supporting other communication protocols are deemed within the scope of the present disclosure. For example, a ground contact need not be provided. Other forms of contacts include a single piece of conductive material, non-spring contacts that are configured to contact the data contact pads when the seal is compressed, or pogo pin or other button-like contacts that recede into the module when the seal is compressed to complete the circuit.

The data contacts of an LED module operate in the same fashion as the power contact. Specifically, the data contacts are configured to align with the data contact pads of a contact plate, then when the LED module is attached to the support structure, the data contacts are compressed and flattened such that a linear flattened surface of the data contact is in contact with the data contact pad of the contact plate.

According to aspects of the present disclosure, the surface area of the power contact of an LED module and those of a contact plate may be increased, to provide two or more times greater surface area contact compared to pin and barrel connectors. The increased surface area can reduce the detrimental influence of corrosion on the system operation longevity.

According to aspects of the present disclosure, in other embodiments, the LED modules are equipped with short-range transceivers. The short-range transceivers allow for module to module communication of data signals. The display modules are otherwise similar to the modules of the previous embodiments, except that the previously described data transmission architecture, either over the power distribution bus or over separate data transmission lines are no longer needed.

In these embodiments, the LED module may receive power through either the contact pad of a contact plate or through direct contact with the power bus.

The LED modules receive and transmit operation data and information through the short-range transceivers. The transceivers may utilize optical, radio, or other wireless communication methods known in the art. Preferably, the short-range transceiver of one module is positioned such that it is adjacent a short-range transceiver associated with an adjacent LED module. More preferably, all the transceivers are placed at the midpoint of an edge of an LED module. When installed, the modules are spaced apart by a narrow margin such that a small air gap is between the edges of the modules and the transceivers. When the LED modules are mounted to the support structure adjacent transceivers are positioned such that they align and communicate across the small air gap between the modules, increasing reliability and accuracy.

According to at least one embodiment, the first LED module in a row or column receives the input signal wirelessly from a controller. The controller may be a controller associated with a single row or subset of rows, or a single column or subset of columns, or other subset of LED modules, or it may be a master controller for the entire display The module may then act on the signal and/or transfer the signal to the adjacent module in the row or column. In these embodiments, this is performed for each row or column such that every display module has received a signal and an image is produced. Using the wireless transceivers, the system is able to locate the position of the LED modules within the array. This reduces the work required to install the modules because the modules do not need to be programmed with their own location.

According to aspects of the present disclosure, in a further embodiment, the short-range transceivers are used in combination with data connection points. These embodiments may be configured such that the transceivers only communicate the position data or be configured such that transceivers and data contact points are duplicative in that all data and information is passed between the transceivers.

This embodiment uses the contact plate described in previous embodiments. Specifically, the contact plate has the at least one data contact pad to communicate signals to the at least one data connection point on the module and a data transmission line or bus provides a signal to the data connection pads of the contact plate. Power is provided to the contact plate as described herein.

The display modules of this embodiment have both the short-range transceivers and the data contact points, and both the short-range transceivers and the data contact points are the same as those described above in previous embodiments. The module may receive duplicate signals from the transceiver and the data bus, or only one of the transceiver and data bus may be operational at a time. In this way, redundancy is provided, and the operational longevity of the display can be increased. In this manner, the installation of the modules may be eased by eliminating the need to program each modules location within the array.

The embodiments discussed above may be used in conjunction with a louver panel for increasing visibility and decreasing washout from environment light sources. Such louvers are disclosed in U.S. Pat. Nos. 9,772,655B1, and 10,781,980B2. Each of these patents are incorporated herein in their entirety by reference unless there is a conflict between the specification herein and that appearing in either of the particular patents, and in such case the specification herein shall take precedence.

The Summary is neither intended nor should it be construed as being representative of the full extent and scope of the present disclosure. The present disclosure is set forth in various levels of detail in the Summary as well as in the attached drawings and the Detailed Description and no limitation as to the scope of the present disclosure is intended by either the inclusion or non-inclusion of elements, components, etc. in this Summary. Additional aspects of the present disclosure will become more clear from the Detailed Description, particularly when taken together with the drawings.

The phrases "at least one," "one or more," and "and/or," as used herein, are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

The term "a" or "an" entity, as used herein, refers to one or more of that entity. As such, the terms "a" (or "an"), "one or more" and "at least one" can be used interchangeably herein.

Unless otherwise indicated, all numbers expressing quantities, dimensions, conditions, ratios, ranges, and so forth used in the specification and claims are to be understood as being modified in all instances by the term "about" or "approximately". Accordingly, unless otherwise indicated, all numbers expressing quantities, dimensions, conditions, ratios, ranges, and so forth used in the specification and claims may be increased or decreased by approximately 5% to achieve satisfactory results. Additionally, where the meaning of the terms "about" or "approximately" as used herein would not otherwise be apparent to one of ordinary skill in the art, the terms "about" and "approximately" should be interpreted as meaning within plus or minus 5% of the stated value.

The use of "including," "comprising," or "having" and variations thereof herein is meant to encompass the items listed thereafter and equivalents thereof as well as additional items. Accordingly, the terms "including," "comprising," or "having" and variations thereof can be used interchangeably herein.

It shall be understood that the term "means" as used herein shall be given its broadest possible interpretation in accordance with 35 U.S.C., Section 112(f). Accordingly, a claim incorporating the term "means" shall cover all structures, materials, or acts set forth herein, and all of the equivalents thereof. Further, the structures, materials, or acts and the equivalents thereof shall include all those described in the Summary, Brief Description of the Drawings, Detailed Description, Abstract, and Claims themselves.

BRIEF DESCRIPTION OF THE DRAWINGS

The accompanying drawings, which are incorporated in and constitute a part of the specification, illustrate embodiments of the disclosed system and together with the general description of the disclosure given above and the detailed description of the drawings given below, serve to explain the principles of the disclosed system(s) and device(s).

The drawings are not necessarily (but may be) to scale. In certain instances, details that are not necessary for an understanding of the disclosure or that render other details difficult to perceive may have been omitted. It should be understood, of course, that the disclosure is not necessarily limited to the embodiments illustrated herein. As will be appreciated, other embodiments are possible using, alone or in combination, one or more of the features set forth above or described below. For example, it is contemplated that various features and devices shown and/or described with respect to one embodiment may be combined with or substituted for features or devices of other embodiments regardless of whether or not such a combination or substitution is specifically shown or described herein.

DETAILED DESCRIPTION

Figure 3:
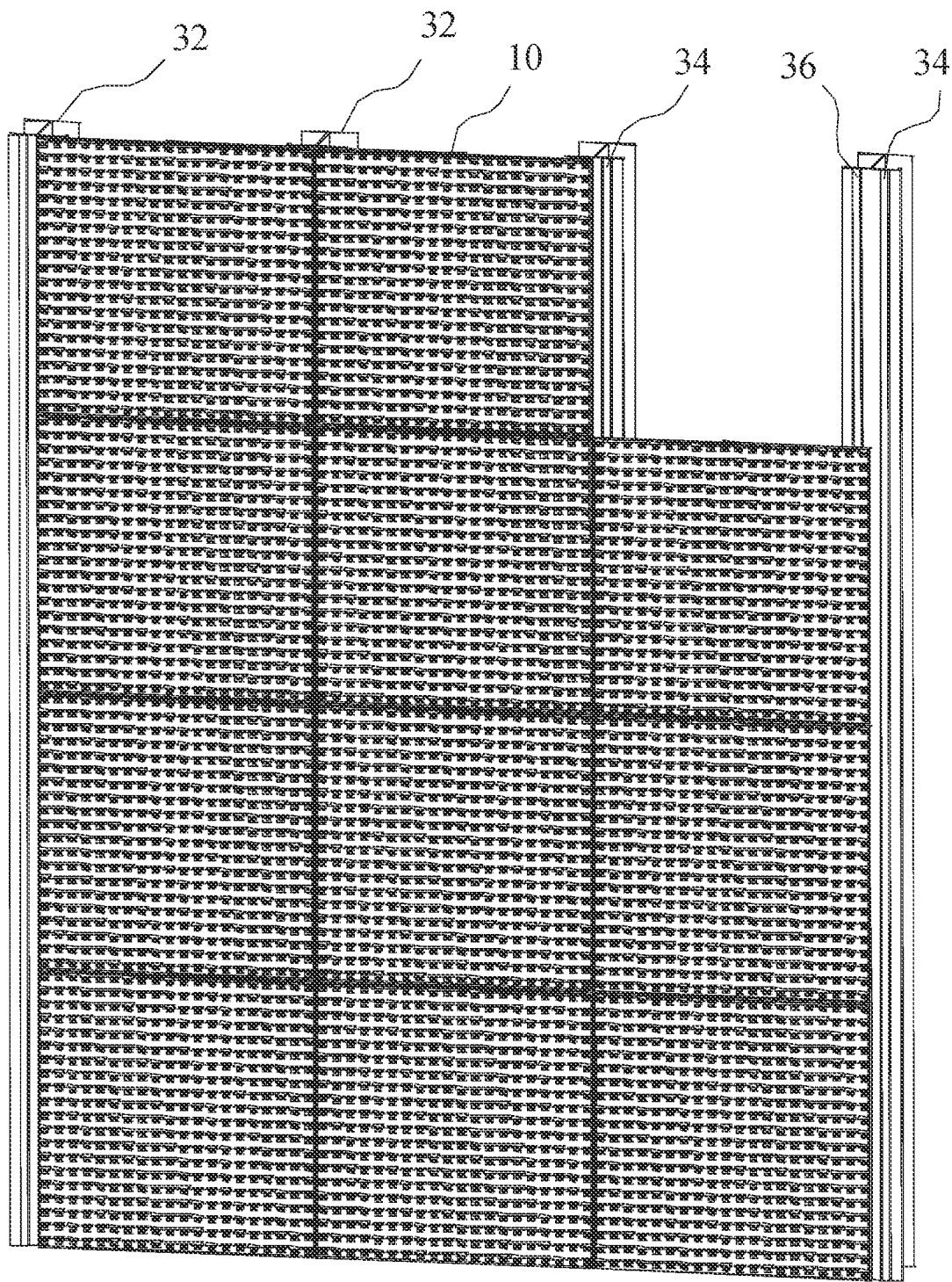
FIG. 3 is a front view of an LED module array or display, with one module removed, showing an embodiment of an integrated power bus.

The present disclosure describes a system and method for cableless connection of the power and data buses between LED modules 10 used in an electronic display 4 which consists of one or more individual modules 10. An array of multiple modules 10 is shown in FIG. 3.

Figure 1:
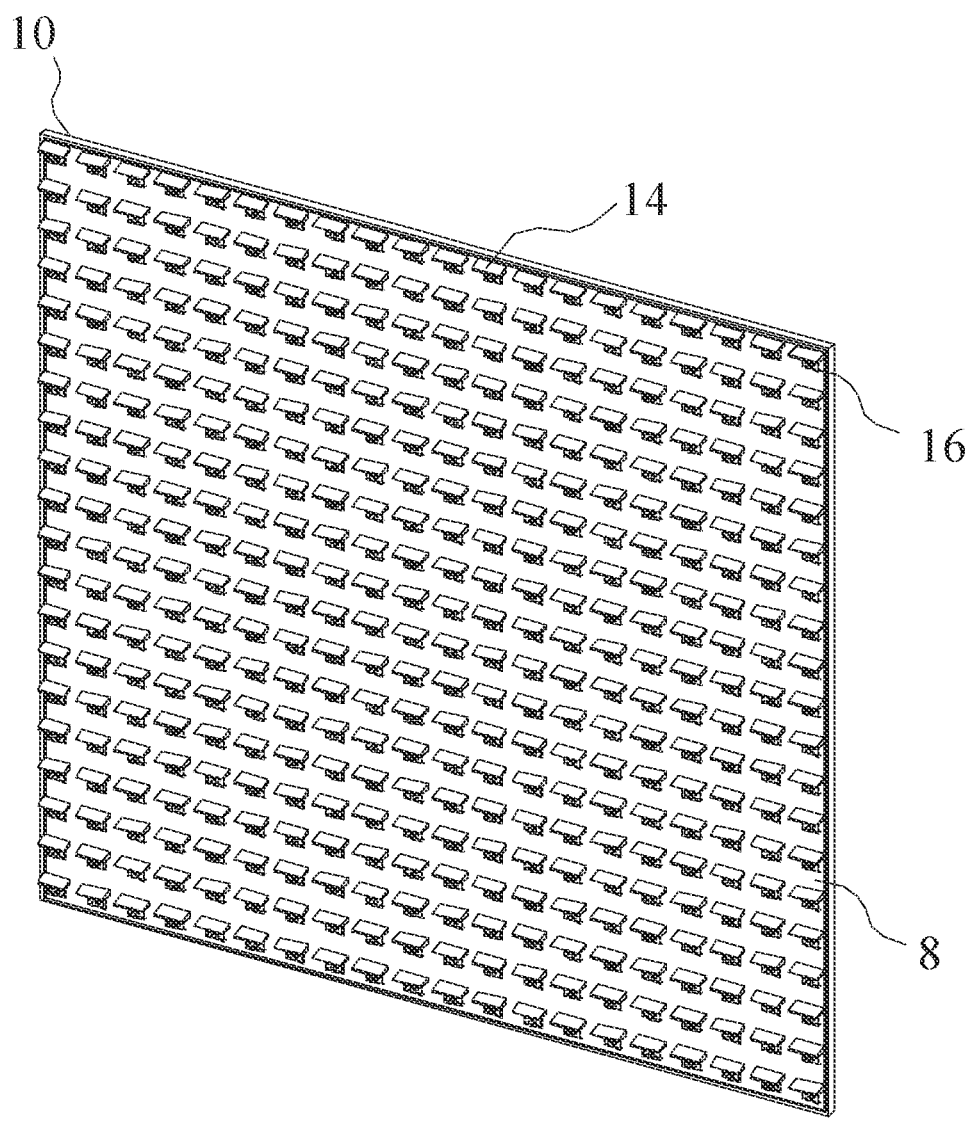
FIG. 1 is a front view of one embodiment of an LED display module.

As shown in FIG. 1, a front surface 8 of an LED display module 10 contains an array of LEDs 16. Each of the plurality of LEDs 16 in the array is connected to a printed circuit board located within the module 10 that provides power and control or operations signals to the LEDs 16. The front face of the display module 10 contains louvers 14 located above each of the LEDs 16 of the module 10. The louvers 14 provide shade to the LEDs 16 from the environmental lighting and thereby prevent washout and increase visibility of the display. The louvers 14 are optional and may be omitted.

Figure 2A:
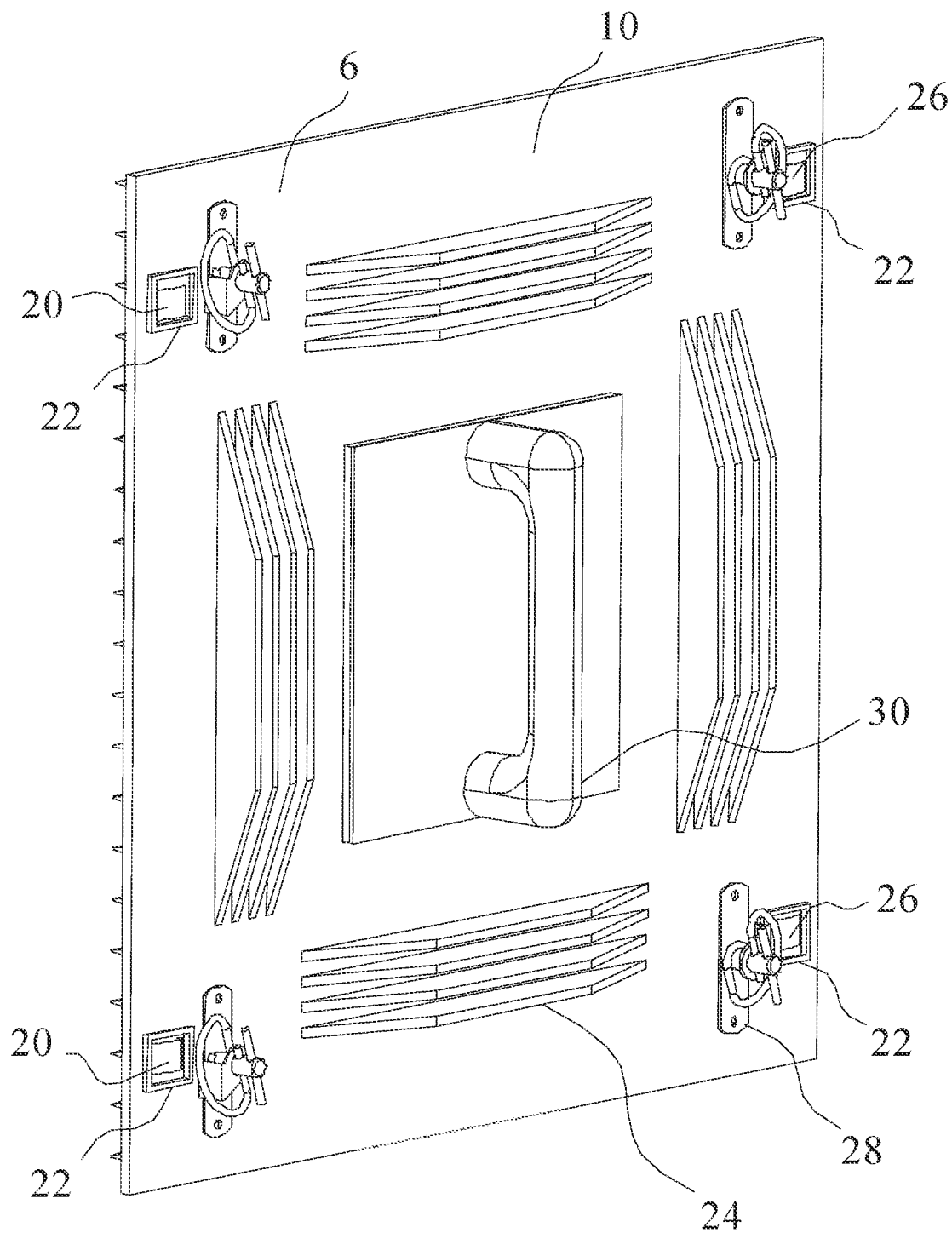
FIG. 2A is a rear view of the LED display module of FIG. 1 showing spring contacts used for contacting and electrically connecting with a power bus, as well as showing an integrated weather seal enclosing the contacts.
Figure 2B:
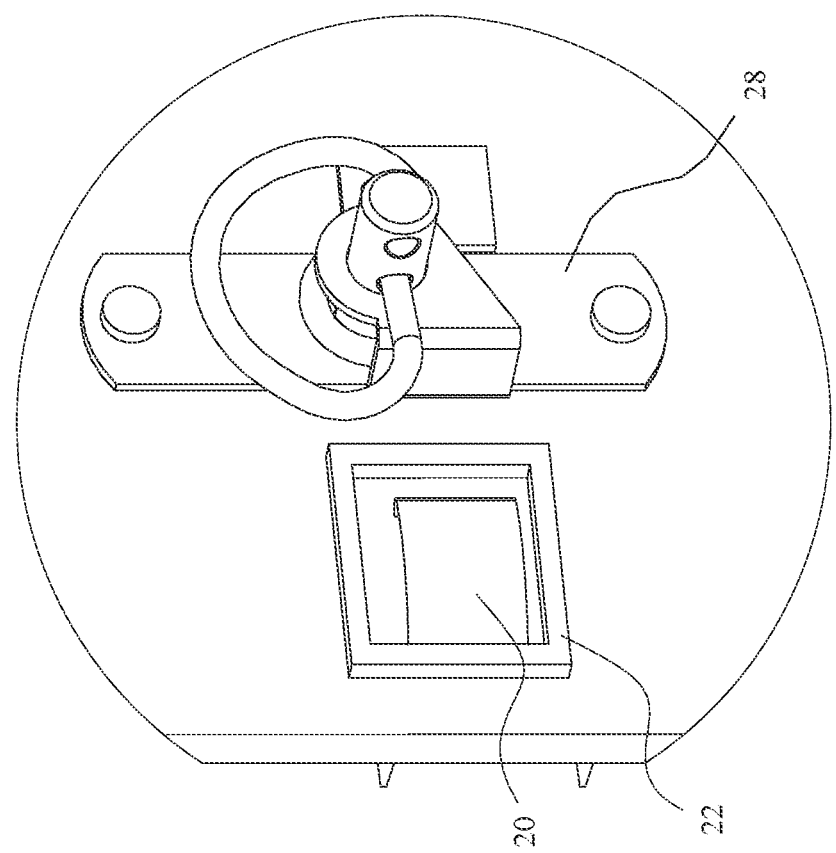
FIG. 2B is an enlarged section showing the spring contact of FIG. 2.

The rear surface 6 of the display module 10 contains the connection points 20, 26 for power transmission, as shown in FIGS. 2A and 2B. In this embodiment, the power contact points 20, 26 provide both power and data to the module 10.

Optionally, a compressible weather resistant seal 22 surrounds the connection points 20, 26 such that a seal is created around the contacts. The seal 22 may be made from weather resistant material such as silicone, rubber, plastic, or other suitable compressible and durable materials known to those of ordinary skill in the art.

The power connections between the module 10 and the power buses 34, 36 are comprised of compressible spring contacts 20, 26. As shown in FIG. 2B, the spring contact 20 is formed from a flat piece of conductive material, preferably a beryllium-copper alloy, plated steel or other appropriate conductive material, that is bowed outward like a leaf spring. When the locking feature 28 secures the module 10 to the support frame 32, the seal 22 is compressed and the spring contact 20, 26 is flattened against the power bus 36, 34 to form a linear contact. As such, there is a biasing force that presses the contact 20, 26 to the power source 36, 34, preventing disengagement. Compared to pin and barrel connectors, a connector of this type may increases the area of contact between a bus 36, 34 and the LED module contact points 20, 26. If corrosion occurs, a larger connection surface area may maintain system operations longer than a smaller contact area. It should also be appreciated that other connection methods may be substituted for the spring contacts as would occur to those of skill in the art upon review of the present disclosure, including, for example, pogo pin and other compressible button-like contacts, or flat contacts.

Power is supplied to an LED module according to the present embodiment through direct connection to a power bus 34, 36 as shown in FIG. 3. As illustrated, a positive bus 36 and a negative bus 34 are provided. In this embodiment, each beam of the support structure 32 has one positive 36 and one negative power bus 34 extending along its length. When an LED module is connected, electrical current flows across the module's 10 internal circuitry between the positive and negative buses to power the LEDs and other module components. Thus, each LED module has at least two contact points 20, 26. One power contact point 20 interfaces with the positive bus 36 and one power contact point 26 interfaces with the negative bus 34. Optionally, there may be more than two contact points, one positive 20, one negative 26, for every module 10. Preferably there are at least four contact points, two positive 20, two negative 26 on each module 10. In one embodiment, one contact point 20, 26 is positioned proximal each of the four corners. As a result of this placement, the display module 10 can be easily positioned level and flat against the support structure 32. When the module 10 is flat against the support structure 32, the seals 22 are able to compress consistently and uniformly to effectively form a seal against the environment. In comparison, if only two contact points are used, the rear face 6 of the LED module will not present a level contact surface and, as a result, spacers may be attached to the rear surface of the module 10 to counter balance the electrical contact points 20, 26 with the surrounding seals 22 and thereby provide a uniform, flat connection. If counter measures are not applied and there are only two contact points 20, 26, the rear surface of the LED module is uneven relative to the mounting surface and the seals 22 are subjected to unequal forces on different sides of the seal 22. These forces may lead to an uneven seal and a reduced weather resistance. Further, having four or more contact points 20, 26 provides redundancy with respect to power and data delivery. If one of the contact points 20, 26 fails, due to corrosion or some other factor, there is another contact point 20, 26 that is available and maintains system operation. This redundancy increases the longevity of the di splay 4.

Figure 2B:
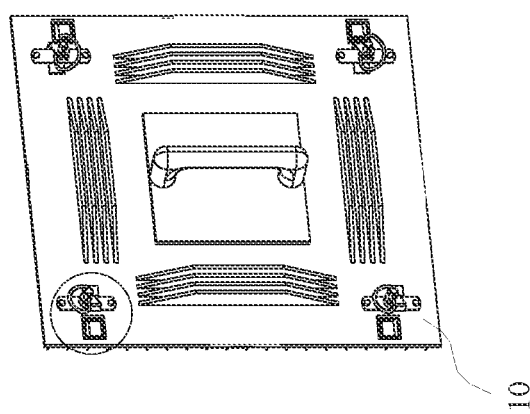

As previously noted, the embodiments of the present disclosure, including the embodiment illustrated in FIGS. 1-3, are not limited to any specific mounting or support structure but may be implemented with any support structure as will be recognized by those of skill in the art upon review of the present disclosure. Thus, while beam shaped support structures are illustrated in some of the figures, the scope of the embodiments described herein are not limited to any specific support structure or architecture.

Continuing with the embodiment of FIGS. 2 and 3, the LED module receives a data signal from a controller for operation of the LEDs. The data signal is superimposed onto the voltage of the power bus 34, 36. The signal is modulated by the controller 52 and then must be interpreted by the module 10. Once the module 10 receives the signal, the module 10 displays an image through the operation of LEDs 16. As such, no additional connections are required to transmit data in this embodiment.

While the connections may be sealed through the seal 22 of the module 10, the remainder of the positive and negative power buses 36, 34 may be either sealed or exposed. As shown in FIG. 3, the power buses 36, 34 may be shielded from some exposure by their positions relative to the support structure 32 and the modules 10. The power buses 36, 34 may be left exposed other than the protection provided by the support structure 32 modules 10 and any sheath or outer coating. In some embodiments, the buses 36, 34 may be integrated into the support structure 32 to provide varying levels of protection or insulation.

FIGS. 2A and 2B illustrate one example of a locking feature 28 that may be used to attach the LED module to a mounting structure. As illustrated, an attachment or locking feature 28 is provided proximate each of the four corners of the LED module. The locking feature shown in FIGS. 2A and 2B is a compression latch 28. With reference to FIG. 3, the compression latch 28 is configured to engage an associated mounting structure, such as the rear surface of a support beam 32. In this embodiment, the latch 28 provides a compressing force on the seal 22 when the latch 28 is in the locking position. In other embodiments, the locking feature may include other mechanical fasteners or attachment means, such as clamps, cams, screws, hook and loop material, or similar features known in the art. According to some aspects of the present disclosure, the locking feature 28 is located on the medial side of the contact point 20, 26. However, in other embodiments, the locking feature 28 may be located on the distal side of the contact point 20, 26 or diagonally in the corners, or at any other location consistent with the architecture of the mounting or support structure.

As shown in FIG. 3, the individual modules 10 are closely positioned relative to each other with little space between the edges of adjacent modules. Close positioning provides for a more seamless overall display but also enhances weather resistance while allowing for thermal expansion.

Some embodiments may include reenforcing or strengthening ribs 24, such as those shown in FIG. 2A. These ribs 24 may be arranged in an array across the rear surface 6. One or more ribs may be used. The ribs 24 may also be used to dissipate heat from the LED module.

Further, each LED module may include a handle 30. In some embodiments, the handle 30 is mounted to the center of the rear face 6 of the module 10. Alternatively, the handle 30 may be off center. The handle 30 is provided to facilitate physical manipulation of the LED module and ease installation and removal procedures. The handle 30 may be made of plastic, metal, polymeric, rubber, or other suitably rigid material.

Figure 4:
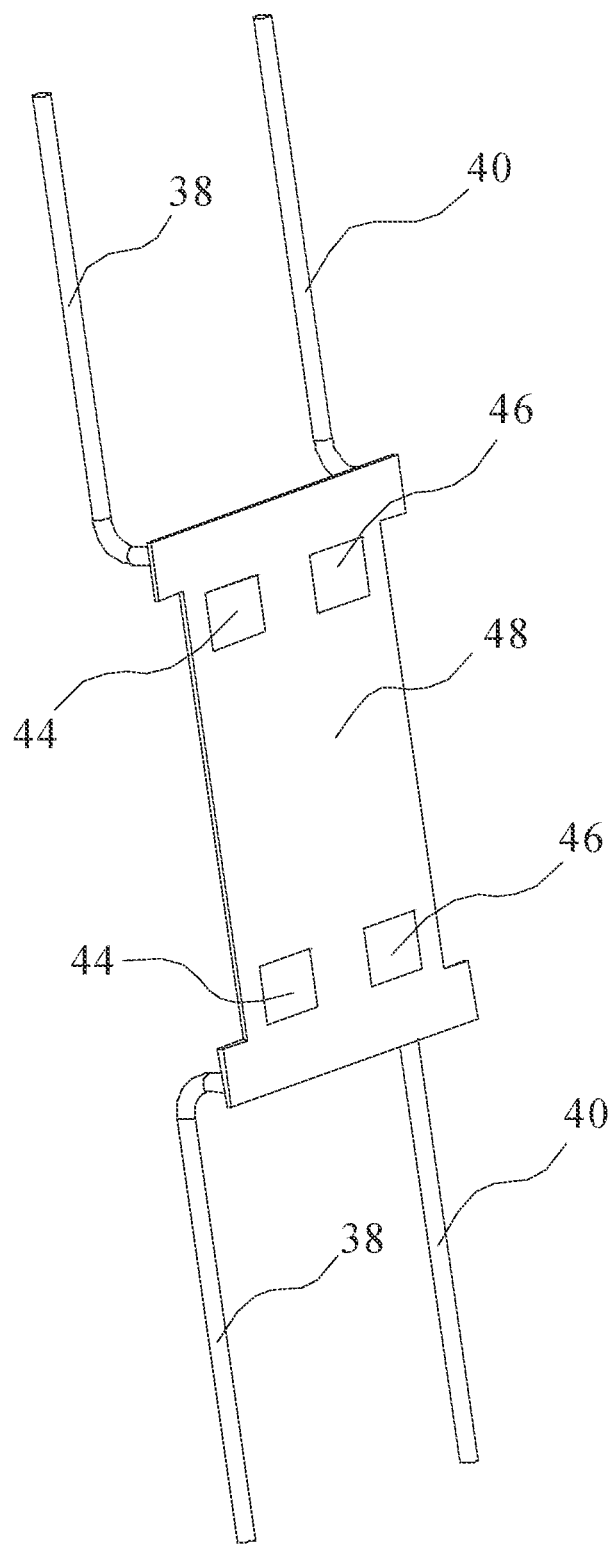
FIG. 4 is a front view of the contact plate having power contact pads and power distribution lines or wires.
Figure 5:
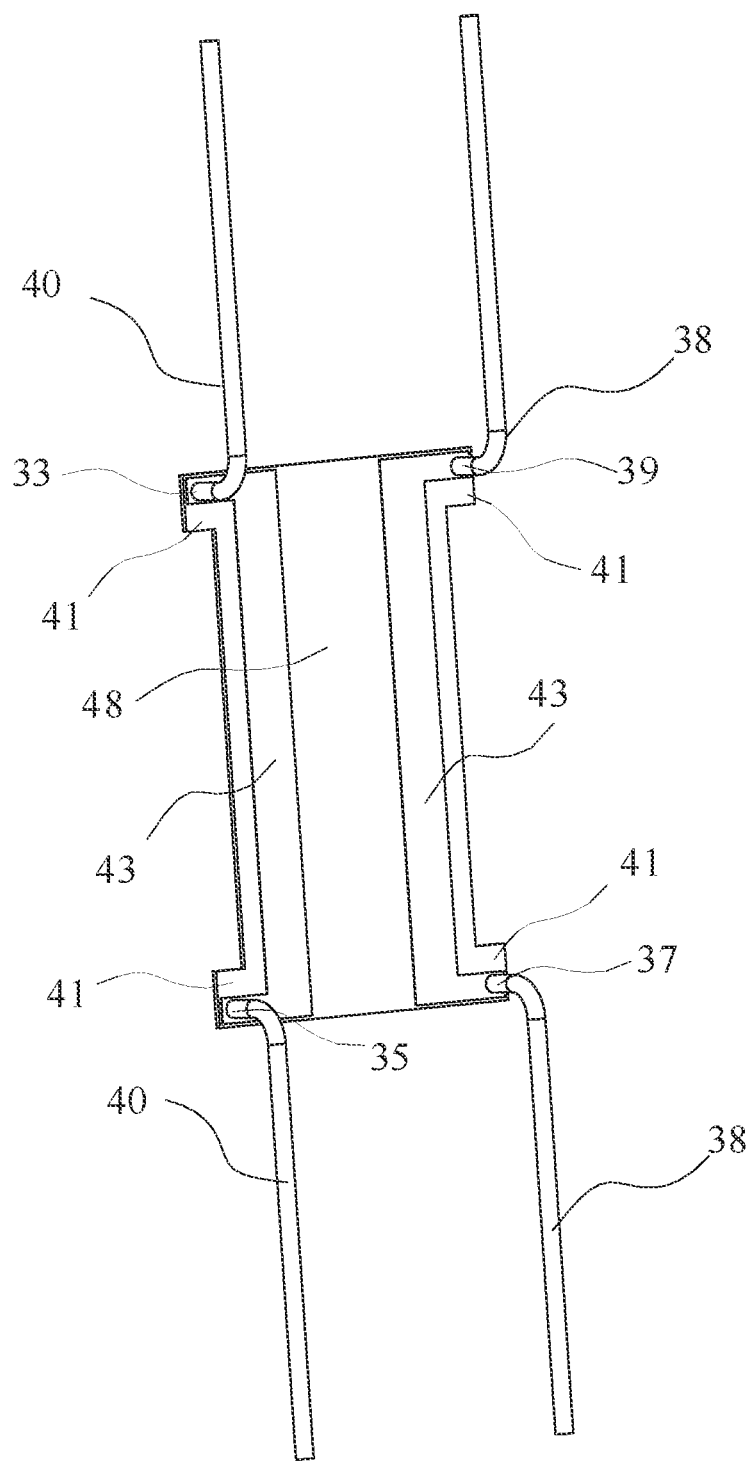
FIG. 5 is a rear view of the contact plate of FIG. 4.

According to aspects of the present disclosure, in another embodiment, a contact plate 48 as shown in FIGS. 4 and 5 is provided and interfaces with the LED module. In this embodiment, the contact plate 48 contains contact pads 44, 46 that are intended to form a connection with the contacts 20, 26 on the module 10.

Figure 6B:
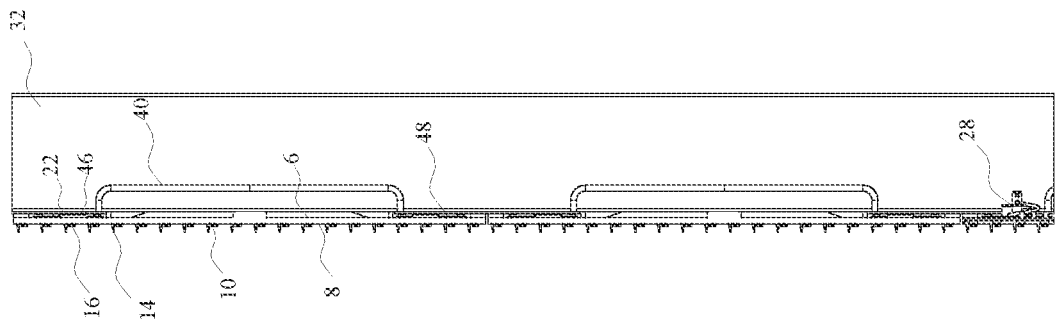
FIG. 6B is a cross sectional view of the array of FIG. 6A taken at line A-A.
Figure 6A:
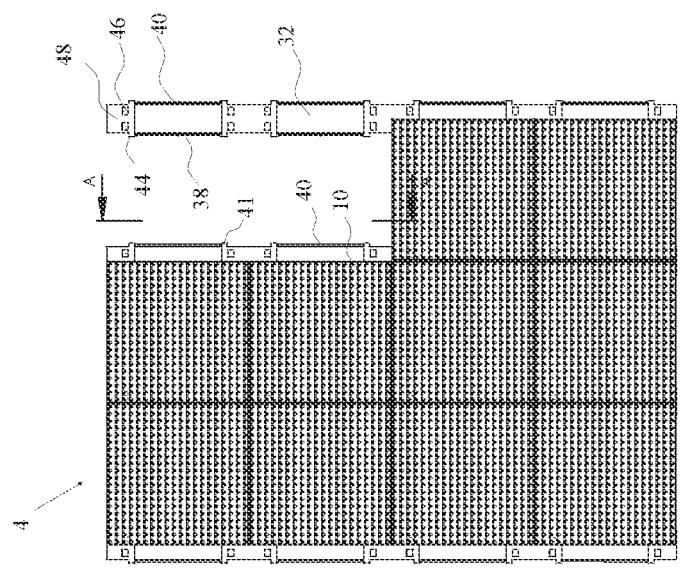
FIG. 6A is a front view of an array of LED modules with two modules removed to show contact plates with power contacts.

As shown in FIGS. 4 and 5, the contact plate 48 is generally flat with an "I" shape to complement the shape of the mounting structure 32. It should be appreciated that the body may have any shape that satisfies the functional requirements described herein and complements the shape of the mounting structure. Here, a rectangular body portion includes contact pads 44, 46 located proximal the corners of the contact plate 48 as shown in FIG. 4. As shown in FIG. 5, the power distribution lines 36, 34 connect to the opposite side of the contact plate 48 at lateral extensions 41. The lateral extensions extend laterally beyond the underlying mounting structure to provide room for the power lines to connect to the contact plate 48. The positive and negative power lines 36, 34 extend between and connect adjacent contact plates 48 as illustrated in FIGS. 6A and 6B.

The contact plate 48 is comprised of a printed circuit board that includes conductive traces 43 to allow for electrical signals to be passed between connection points of the contact plate 48. Thus, for example, multiple positive power contact pads 44 on the contact plate 48 may be electrically connected and multiple negative power contact pads 46 maybe electrically connected. As illustrated in FIGS. 4 and 5, a first trace 43 provides a pathway across the PCB or contact plate 48 that connects first and second contact pads 44 and second trace 43 provides a second pathway that connects first and second contact pads 46. More particularly, the positive power line 38 connects to the trace 43 at spaced connection points 37 and 39, and the negative transmission line 40 connects to the contact plate 48 at spaced connection point 33 and 35. The contact pads 44 are also electrically connected to the first trace 43 and contact pads 46 are electrically connected to the second trace 43. While the traces 43 are illustrated on the bottom of the contact plate in FIG. 5, alternatively they may be located on the opposite surface interconnecting first and second contact pads 44 and first and second contact pads 46, or internal to the contact plate, for example if the contact plate were constructed in layers. If located on a surface of the contact plate it would still be embedded in a potting material or other polymer or resin. As would be appreciated, the cover layer would need to be removed to make a connection. If a trace 43 is located on a different layer or plane from the contact pads 44, 46, vias may be used to make electrical connections.

The contact plate 48 can be attached to the support structure 32 through various means. These means may include mechanical fasteners or means, such as bolts, screws, hook and loop material, adhesives, or through the clamping force of the locking feature 28 of the module 10. Further, the contact plate 48 can be bonded to the power lines 36, 34 by soldering, thermal bonding, compression bonding, ultrasonic welding and other connection methods known to those of skill in the art. Alternatively, the power lines 36, 34 may be attachable to the contact plate 48 through removable methods such as a plug in wire-to-board connectors, screw on or through other fastening techniques including electrical clamps.

In this embodiment, the LED module 10 is similar to the LED module described above. The LED module 10 receives power from the power distribution lines 36, 34 in addition to a modulated signal that has been superimposed onto the power bus 34, 36. The module 10 decodes the signal and then performs the operations encoded on that signal.

In operation, when the spring contacts 20, 26 of the LED module 10 contact a positive 44 and negative contact pad 46 of a contact plate 48, an electrical circuit is completed across the module 10 between the contact pads interconnected to the positive and negative power lines 38, 40. As illustrated in FIGS. 6A and 6B, in the described embodiment a contact plate 48 generally provides power and data to at least two separate LED modules 10, for example, LED modules along an edge of an overall display. However, a contact plate 48 located at the interior of a display may participate in providing power and data to four LED modules. With respect to the embodiment illustrated in FIGS. 6A and 6B, the positive power line 38 and the negative power line 40 for a single LED module 10 are disposed on separate, adjacent mounting beams 32. When mounted to the support structure, an LED module spans the gap between adjacent mounting beams and is electrically connected to at least two contact plates 48.

In another embodiment, data is provided to the module 10 through a separate data transmission line 42 rather than carried over and modulated onto the power distribution. In this embodiment, the contact plate 48 has data contact pads 50 that connect to data connection points 18 on the module 10.

Figure 8:
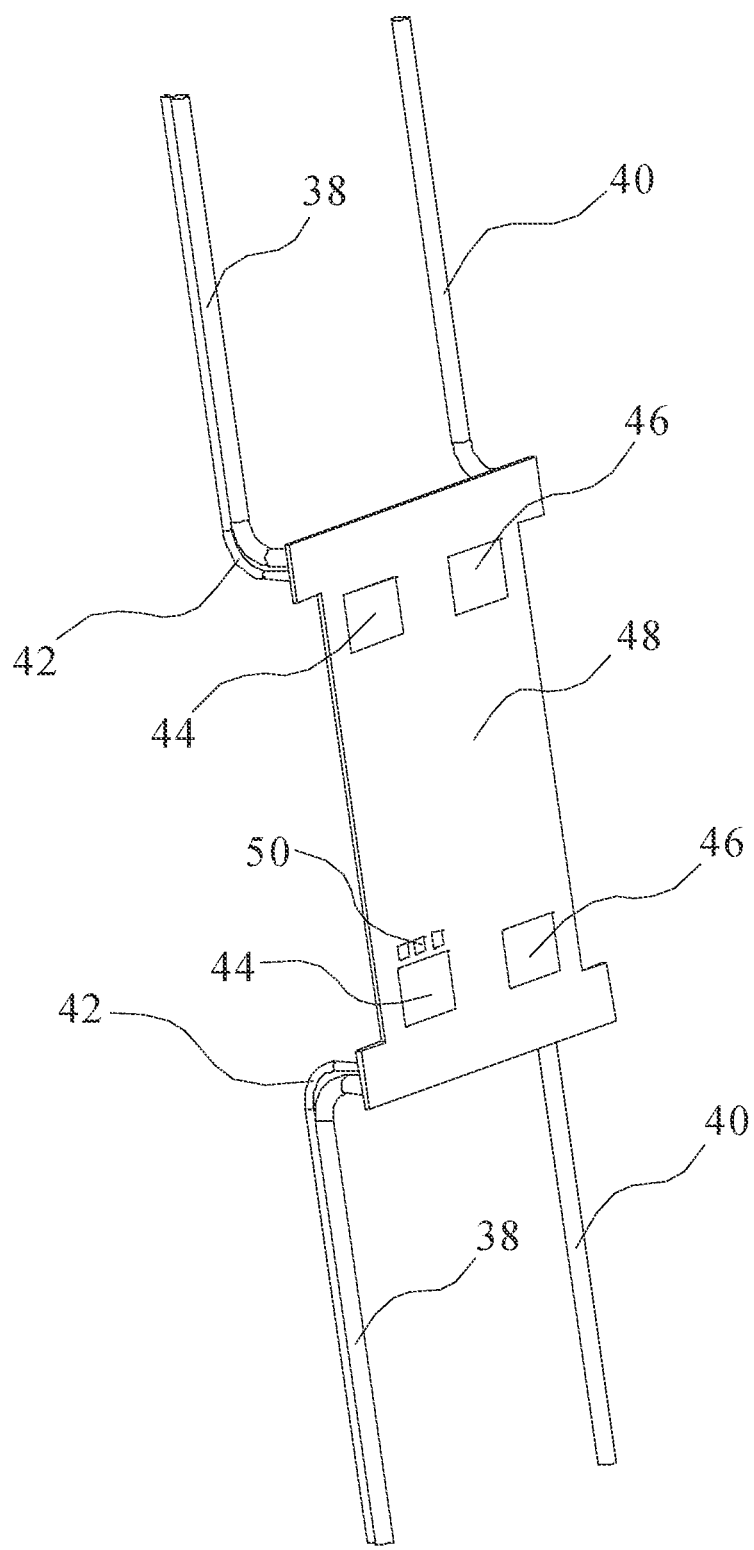
FIG. 8 is a front perspective view of a contact plate having a power contact pad and a set of data contact pads, and further showing separate power and data buses.

Turning to FIG. 8, the contact plate 48 is similar to the contact plate described in the previous embodiment (FIGS. 4 and 5); however, the contact plate 48 is modified to include data contact pads 50. The data contact pads 50 are located proximal to at least one of the power contact pads 20, 26. FIG. 8 shows three data contact pads 50 located proximal to a single power contact pad 44; however, there may be a single data contact pad 50 and data contact pads 50 may be located at more than one of the power contact pads 44, 46. Any architecture known in the art that is sufficient to transmit data is acceptable, although the use of three separate data contact pads 50, one for positive, negative and ground connections is preferred.

Figure 9:
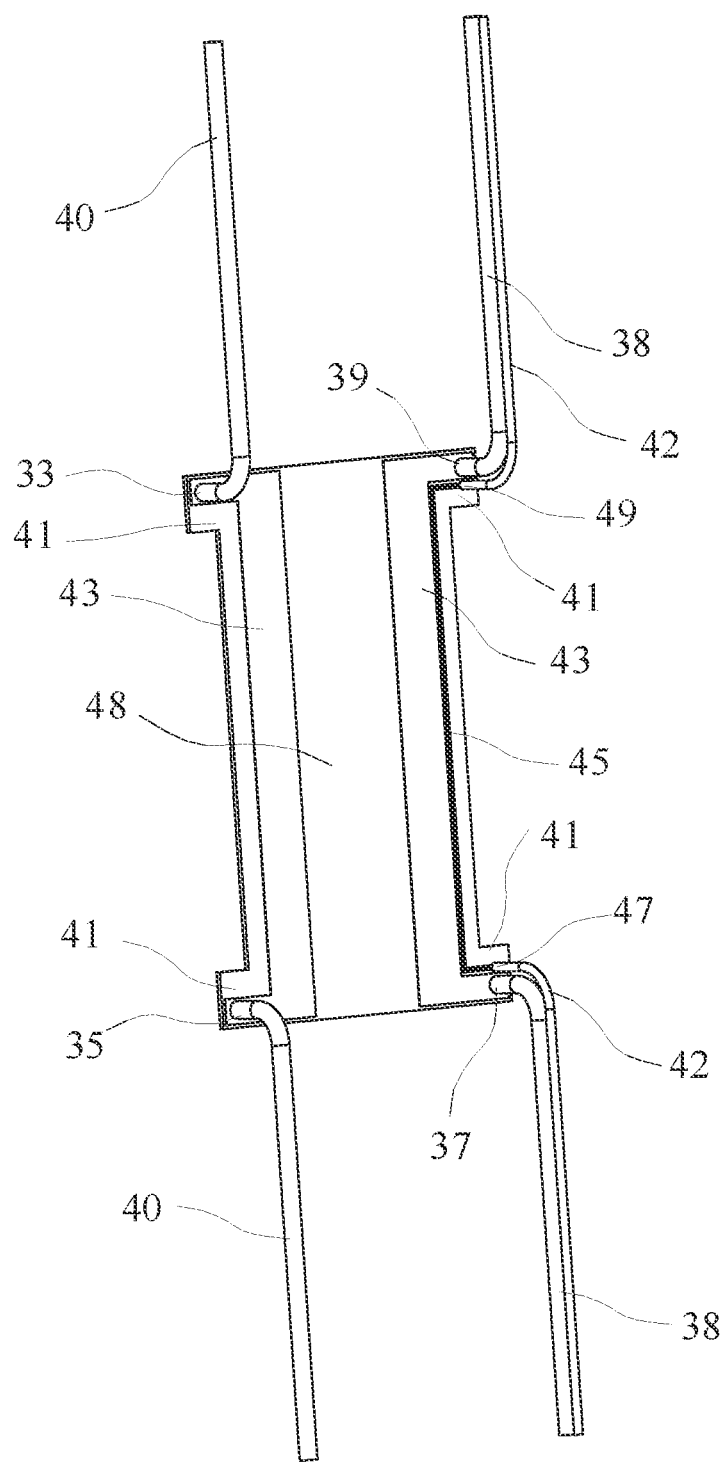
FIG. 9 is the rear perspective view of the contact plate of FIG. 8.

As shown in FIGS. 8 and 9, the data contact pads 50 receive data signals from by way of a data transmission line 42 that is separate from the power transmission lines 38, 40. Two data lines 42 are shown. One provides data input to an LED module 10 and the other passes a data signal to an adjacent LED module 10. In other embodiments, there may be two separate data buses 42 that run parallel to each other. A second separate data line 42 adds redundancy in the event the first data line 42 were to fail.

The data line 42 is attached to the contact plate 48 in similar fashion as the power buses 38, 40 described in the previous embodiment. As shown in FIG. 9, the contact plate 48 contains an electrical pathway or trace 45 that electrically interconnects first and second data lines 42 across the contact plate 48. One data line 42 connects to the trace 45 at a first contact point 47 and the second data line 42 connects to the trace 45 at a second contact point 49 spaced from the first contact point 47. The contact pads 50 are also electrically connected to the trace 45.

Figure 7A:
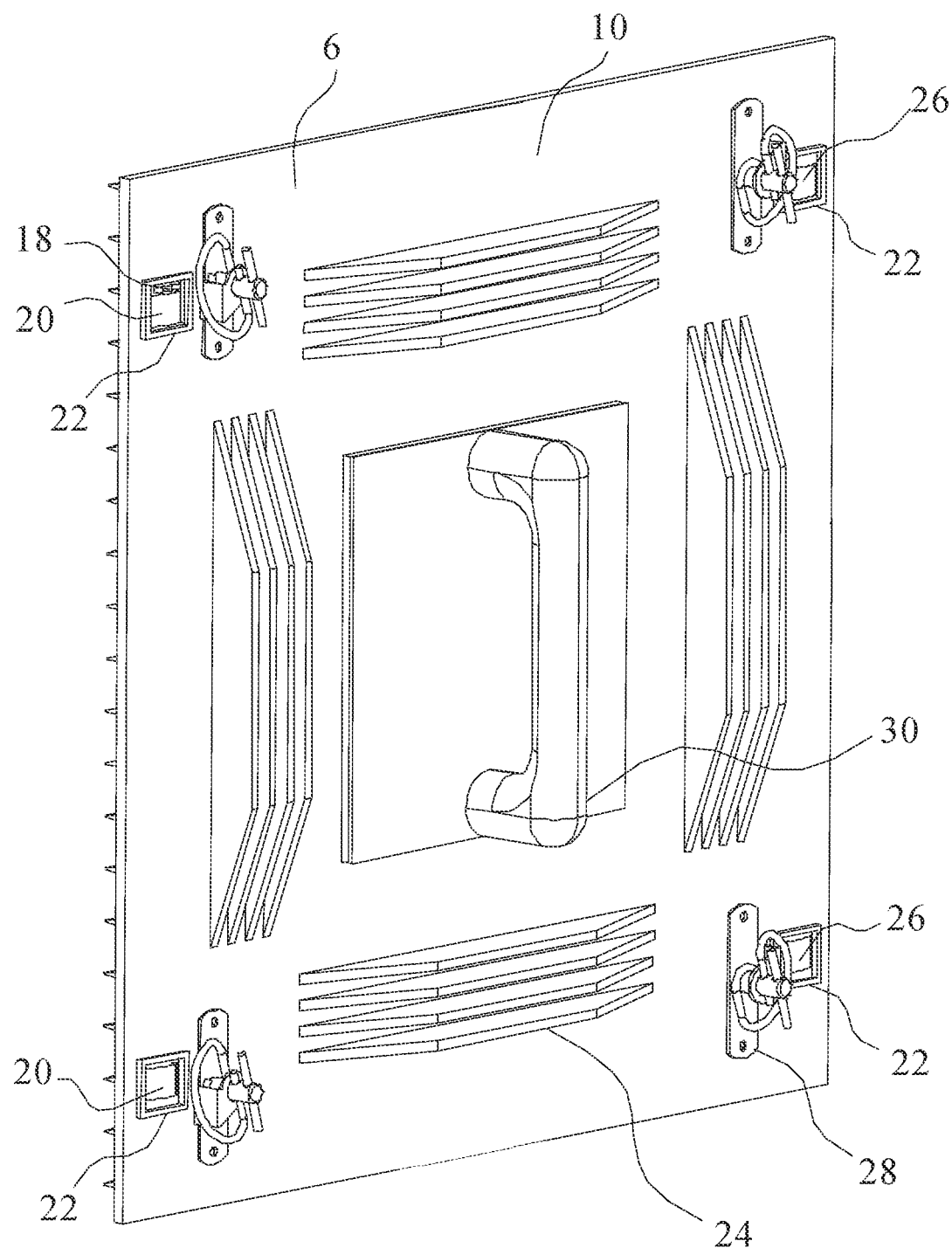
FIG. 7A is a rear view of an LED module having data contacts in addition to power contacts.
Figure 7B:
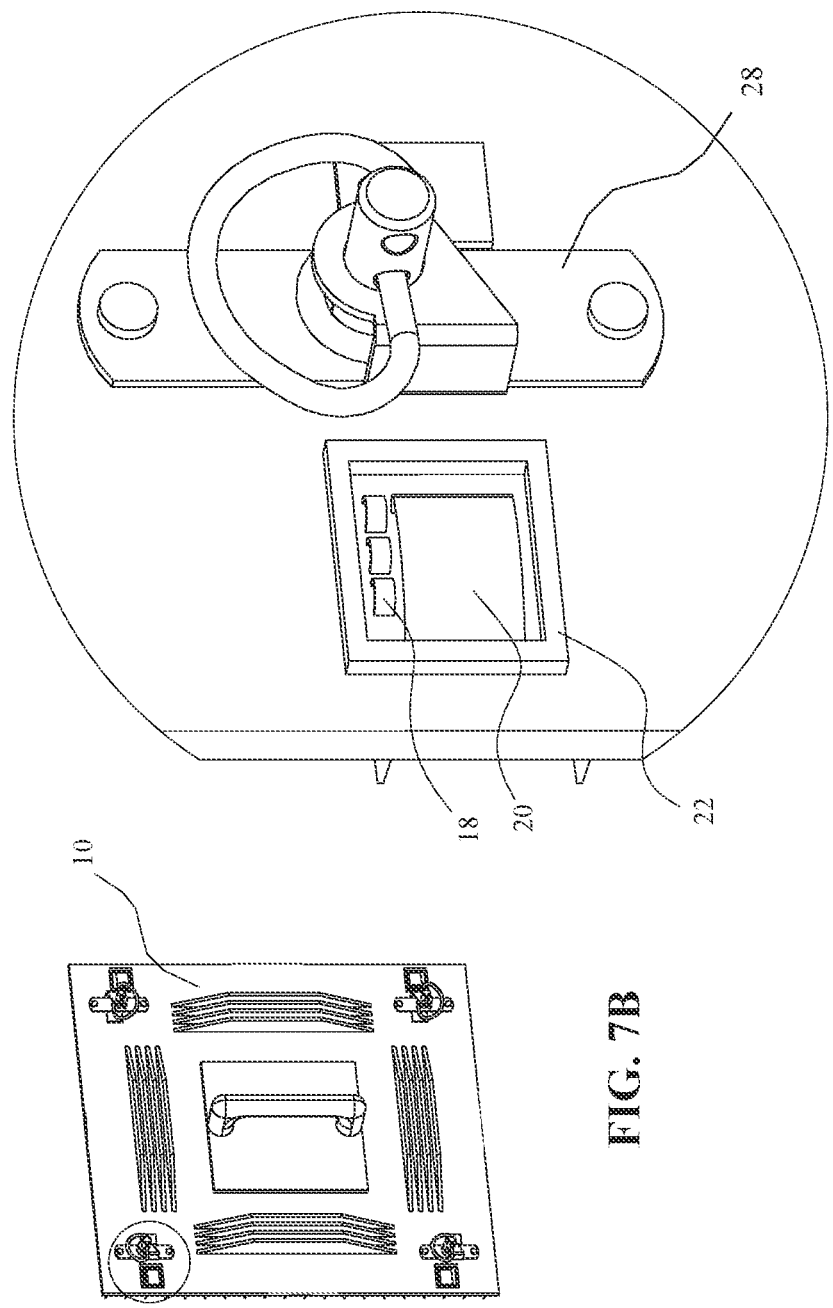
FIG. 7B is an enlarged view of the data contacts shown in FIG. 7A.

In this embodiment, the LED module 10 is modified to include data connection points 18. As shown in FIGS. 7A and 7B, the connection includes three separate data contact points 18. The data contact points 18 are located within the surface area defined by the seal 22 and are protected against corrosion caused by exposure to the environment. The data contact points 18 are similar to the power contact points 20, 26 described in the previous embodiments. The data contact points 18 include a compressible spring formed by a bowed piece of conductive material, preferably a beryllium-copper alloy, plated steel or another appropriate conductive material. When the compressible seal 22 is compressed against the contact plate 48, the data contact points 18 are also compressed against the data contact pads 50 forming an electrical connection. As with the previously discussed contact points, other apparatus for providing secure contact with the contact pads of the contact plate 48 may be substituted for the spring contacts illustrated in FIGS. 7A and 7B. Such alternative connectors include, for example, pogo pins, leaf springs or other spring-loaded pins or buttons, or flat contacts.

As described above, more than one set of data contact points 18 may be provided. For example, data contact points 18 may be provided proximate each power contact 20, 26. Further, while the depicted embodiment of FIGS. 7A and 7B shows three data contact points 18, other embodiments may have only a single contact 18 that contacts a single data contact pad 50. Alternatively, there may be two data contact points 18, one for positive and the other for negative signal transmission.

Figure 10B:
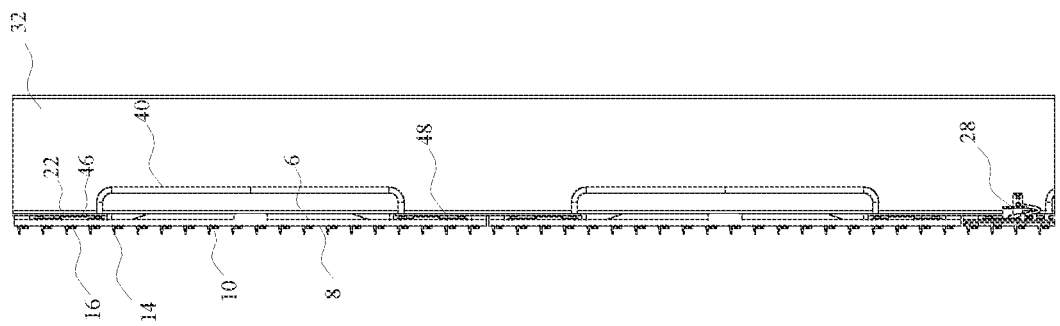
FIG. 10B is a cross sectional view of FIG. 10A taken at line A-A.
Figure 10A:
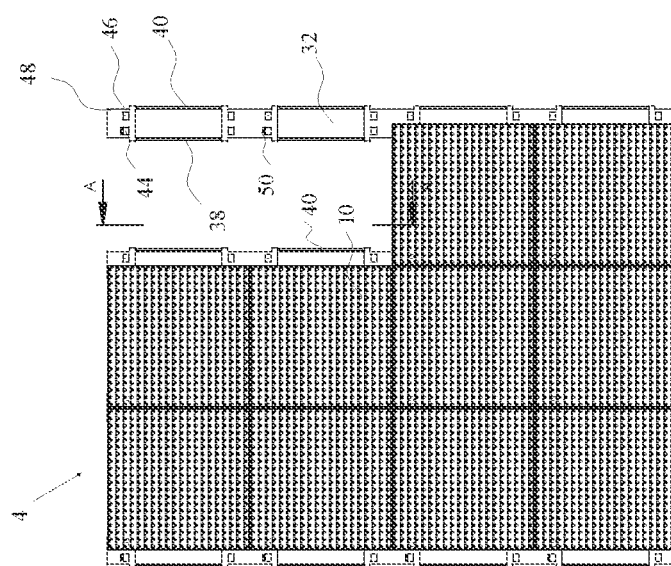
FIG. 10A is a front view of an array of LED modules having two panels removed to show the contact plates with data contact pads.

FIGS. 10A and 10B shows a display 4 according to the embodiment of FIGS. 7A, 7B, 8 and 9 with two of the display modules 10 removed. Contact plates 48 are attached to the support structure 32. As shown, a single LED module 10 is configured to contact a single power contact pad 44, 46 of four different contact plates 48. Similarly, each contact plate 48 is intended to contact four different modules 10, unless the contact plate is located on an exterior edge of the display as shown on the far left of the display 4. As also seen in FIG. 10A, only one of the four contact points of the contact plate 48 contains the data contact pads 50. Thus, the contact plates 48 must be configured such that every LED module 10 interfaces with at least one data contact pad 50. FIG. 10B similarly shows the power bus 34, 36 connecting to the contact plates 48 behind the modules 10.

Figure 11:
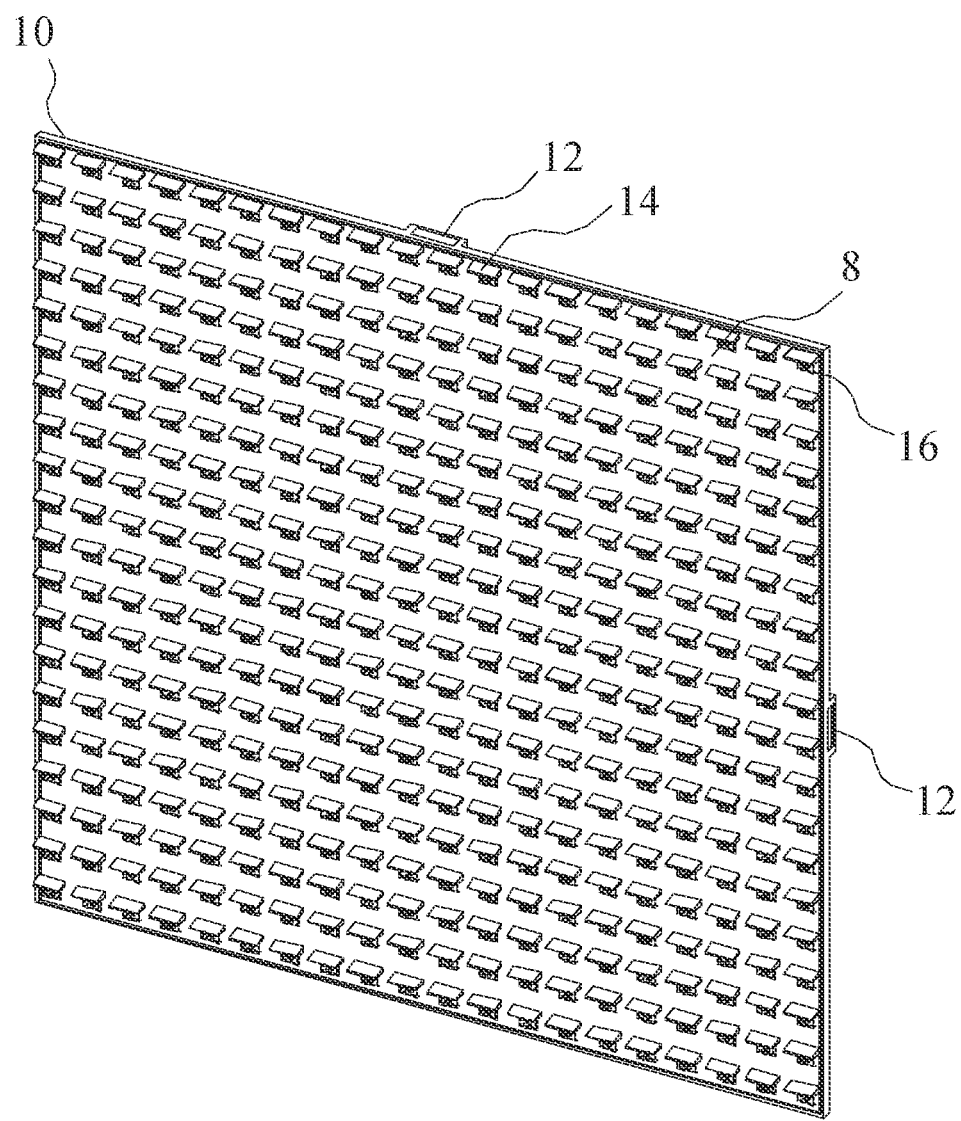
FIG. 11 is a front view of an LED module having short-range transceivers.
Figure 12A:
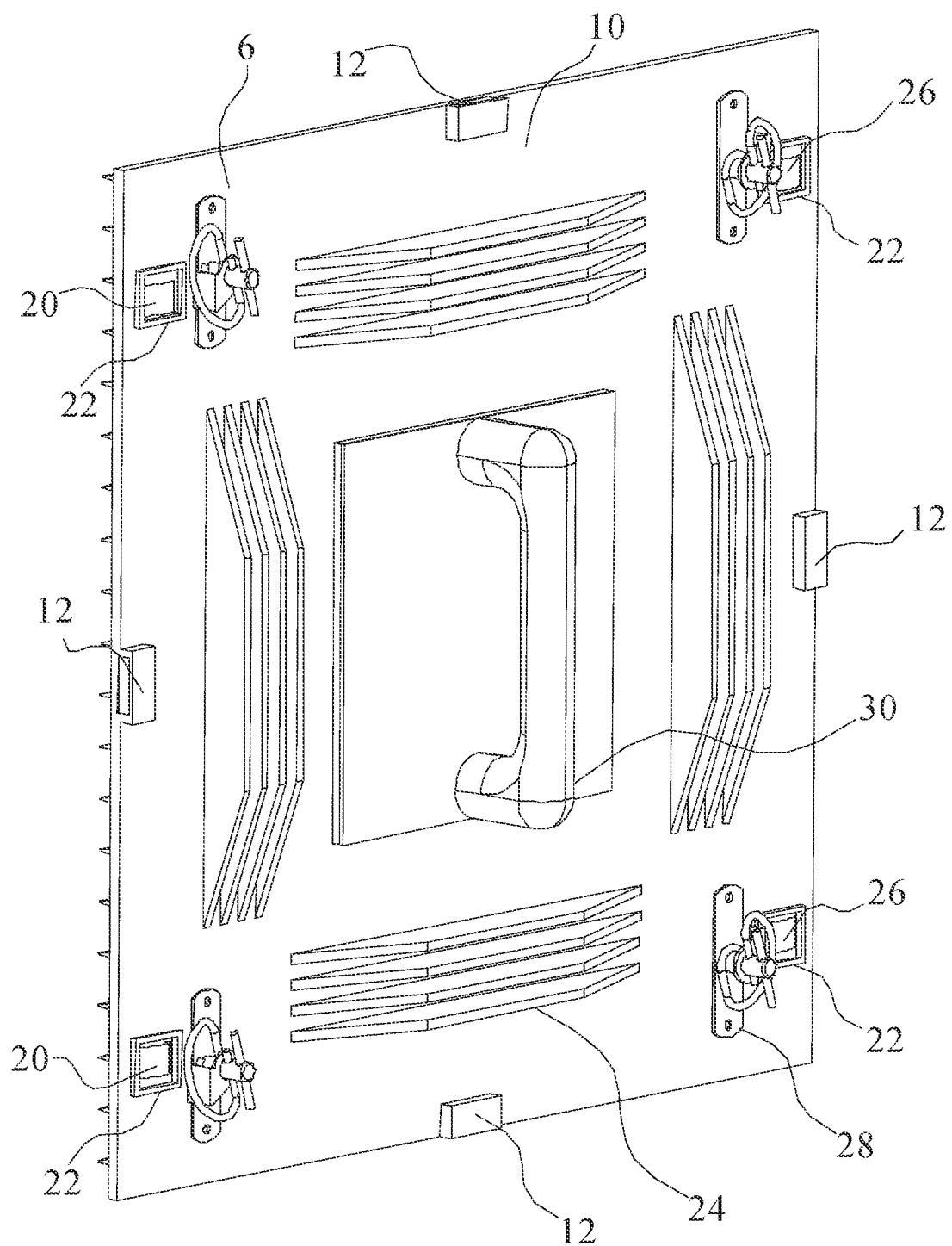
FIG. 12A is a rear view of the LED module of FIG. 11.
Figure 12B:
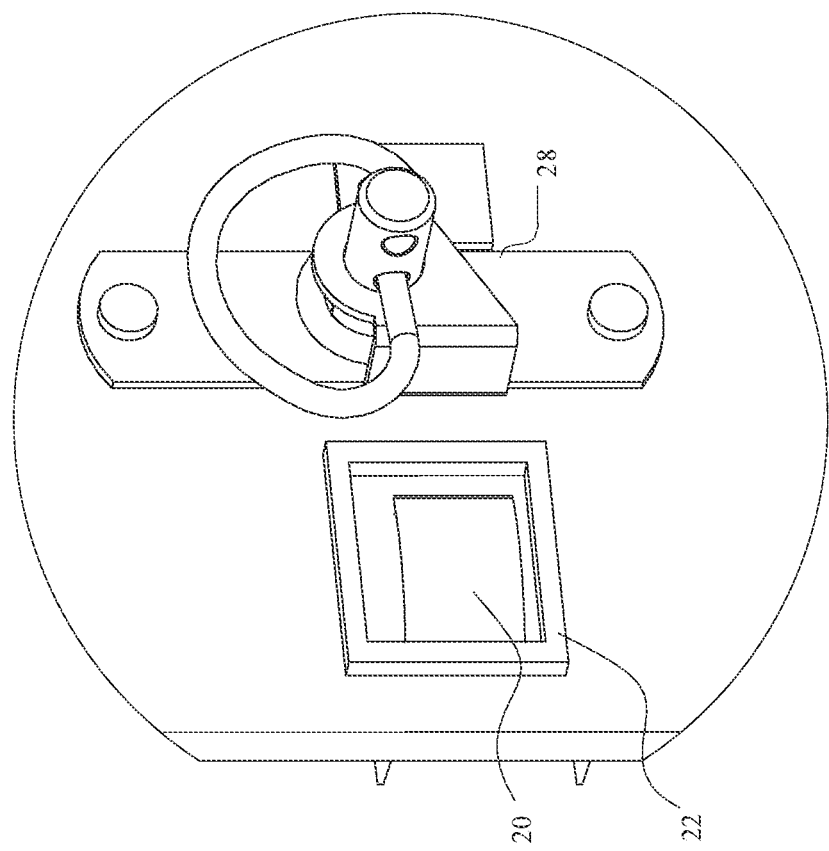
FIG. 12B is an enlarged view of a contact point of FIG. 11.
Figure 12B:
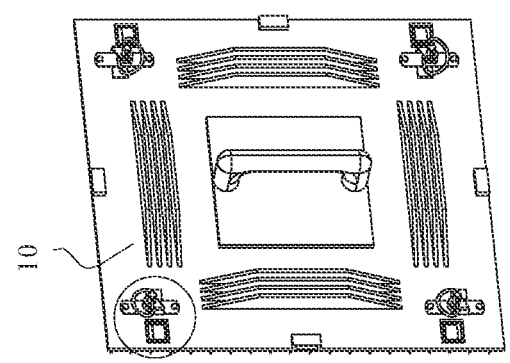
Figure 13:
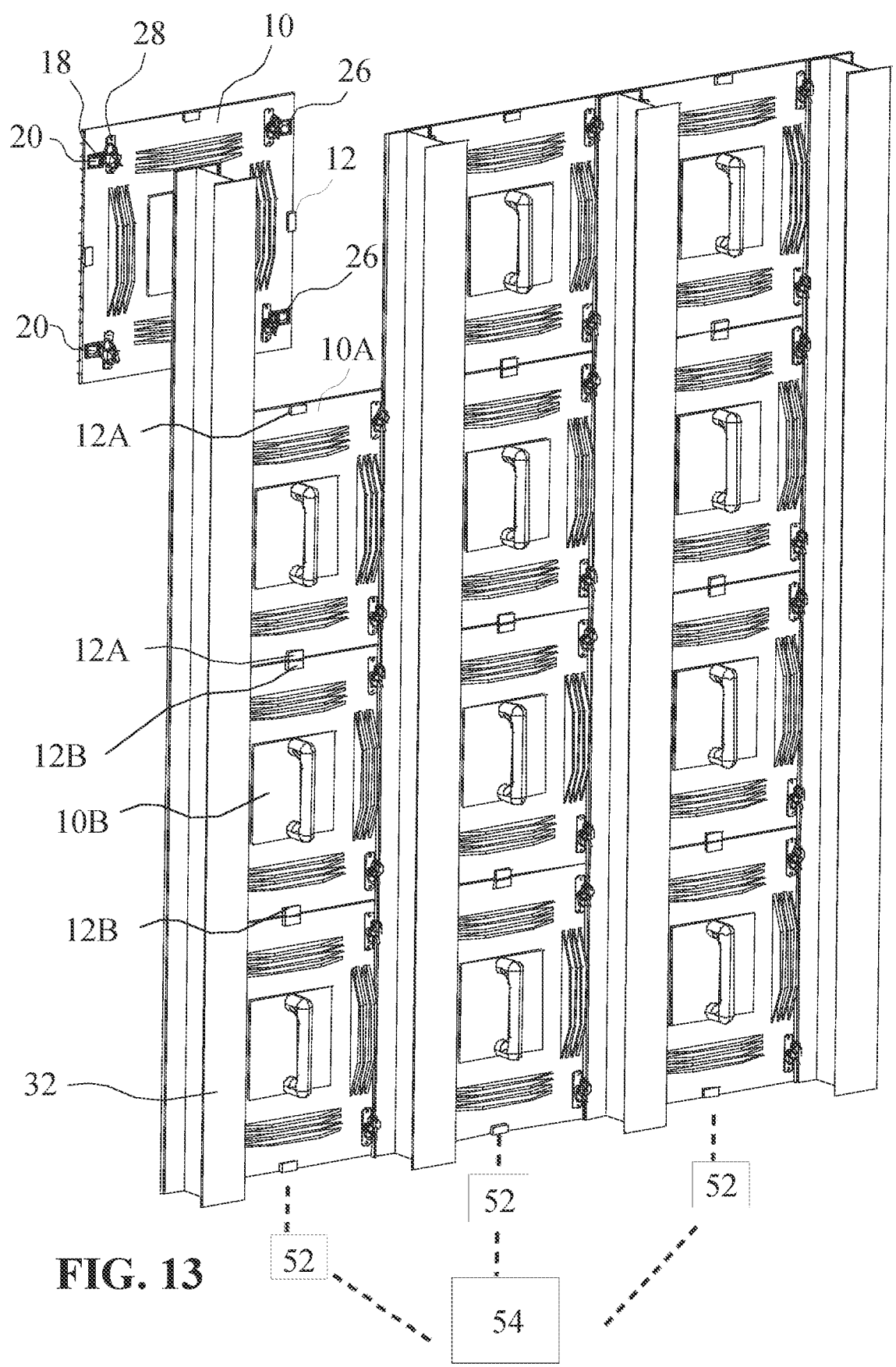
FIG. 13 is a rear exploded view of an LED array using the short-range transceivers.
Figure 14A:
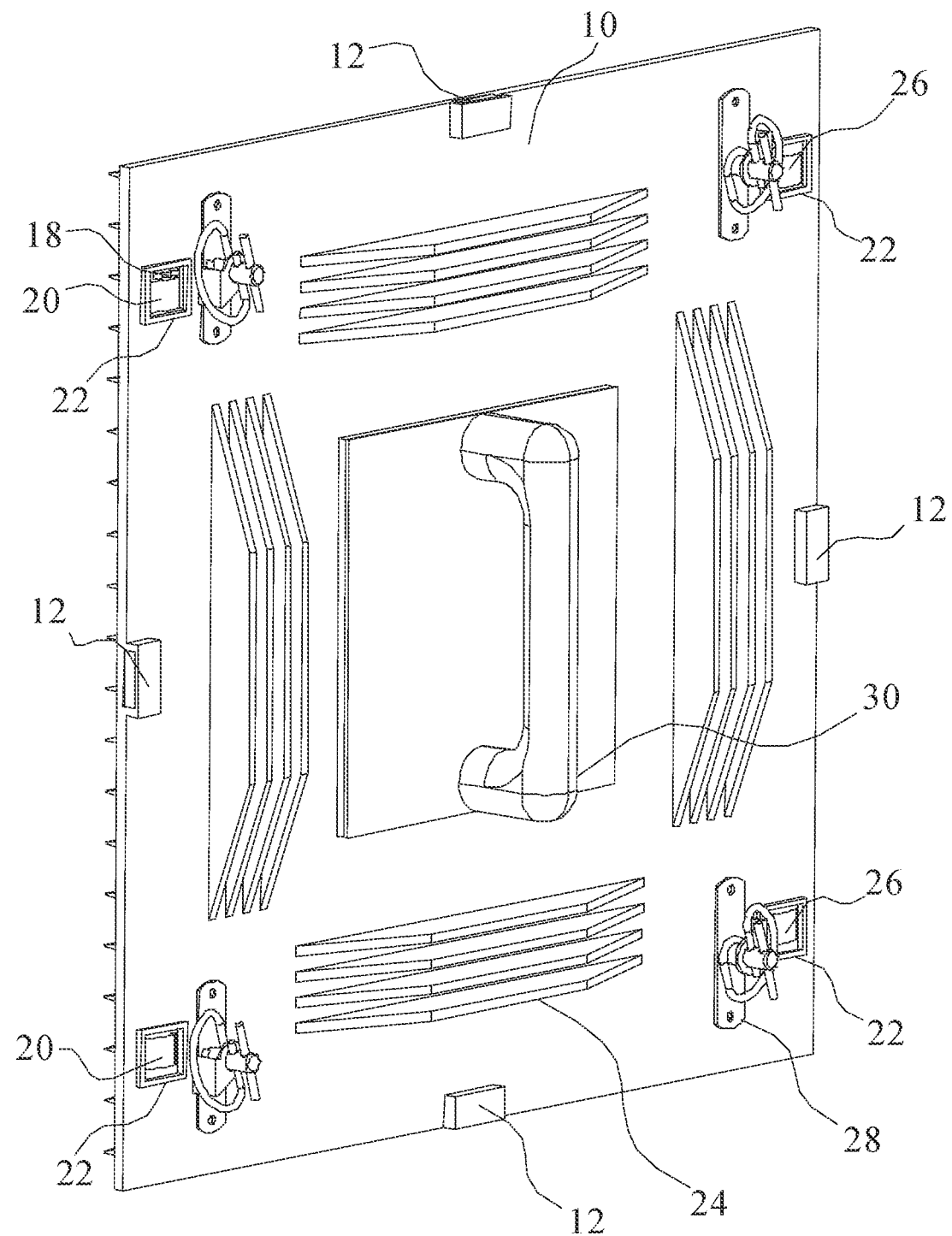
FIG. 14A is a rear view of a LED module using both the short-range transceivers and data connection points.
Figure 14B:
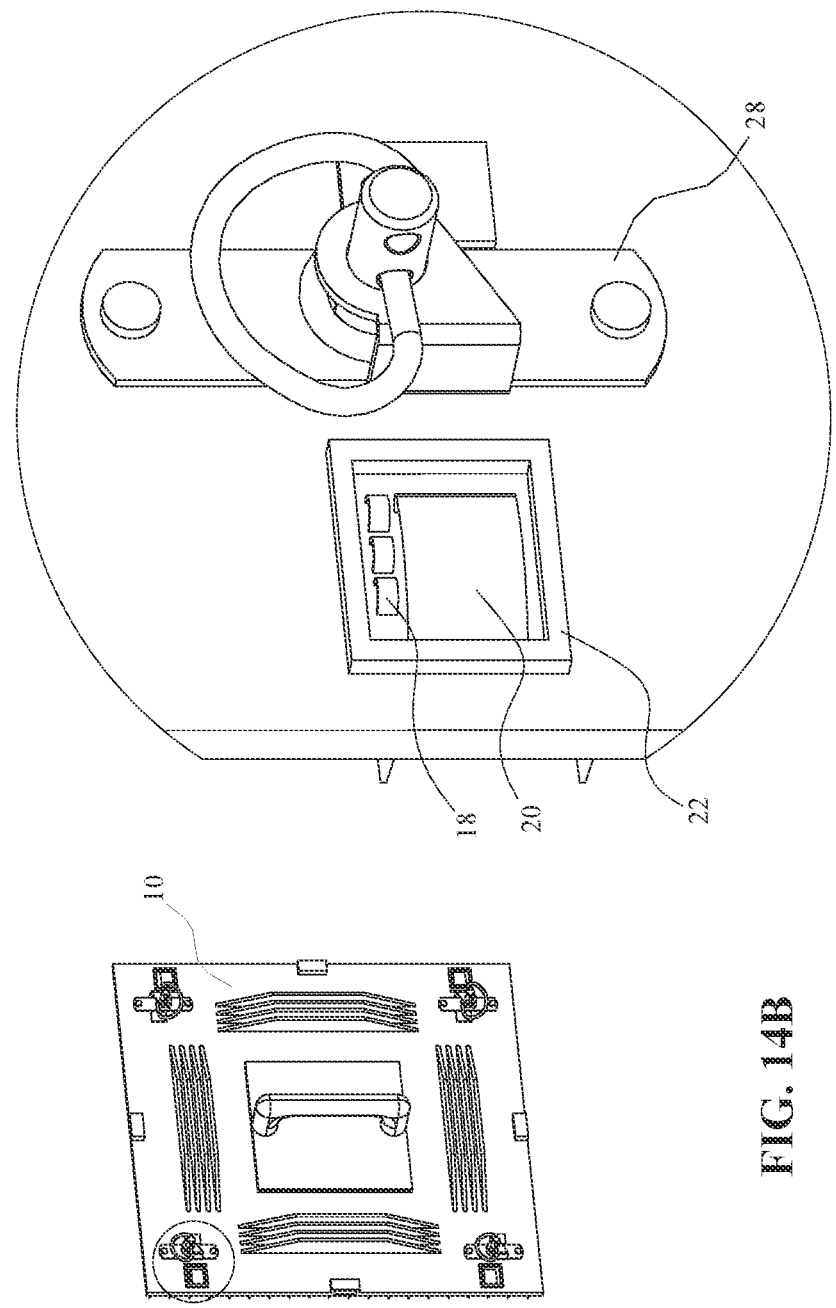
FIG. 14B is a closeup view of the connection point of FIG. 14A.

FIGS. 11-13 show a further embodiment of the display module 10. In this embodiment, data is transferred to the modules 10 using short range transceivers 12. As shown in FIG. 11, the front face of the module is similar to previously described embodiments.

FIG. 12 shows the short-range transceivers 12 located on the exterior edges of the module 10. The transceivers 12 may be placed anywhere along an edge of the LED module provided they physically align with a transceiver on the adjacent module. Preferably, the transceivers are placed in the center of their respective edges such that they easily align when installed.

In operation, the transceivers 12 communicate data across the air gap between two adjacent transceivers 12A and 12B using wireless methods. An example of this is illustrated in FIG. 13 where it is seen that the bottom transceiver 12B associated with LED module 10B is positioned directly opposite transceiver 12A associated with module 10A. Wireless communication methods include optical, radio, or other wireless communication protocols. According to aspects of the present disclosure, in some embodiments a transceiver 12 is only able to communicate with the transceiver 12 adjacent to it and is unable to communicate with non-adjacent transceivers.

As shown in FIG. 13, and in accordance with aspects of the present disclosure, one or more controllers 52 provide instructions to the individual LED modules 10. For example, according to one embodiment, the module 10 located at one end of a column receives a signal with instructions from a controller 52. The LED module 10 then implements those instructions or passes the signal to the next adjacent LED module 10. The signal from the controller 52 may be received by the first module 10 through wireless methods. As such, the controller 52 may have its own short-range transceiver that passes signals to the module 10. This interaction is represented in FIG. 13 by the dashed line from the controller 52 to the bottom transceiver of the bottom modules 10. In some embodiments, a single master controller 54 sends a signal to an intermediate controller 52 associated with each column or with a group of columns. In alternative embodiments, a single master controller 54 communicates with the LED modules 10 without any intermediary controllers 52. While the intermediary controllers 52 in FIG. 13 are shown at one end of each column of LED modules 10, the intermediary controllers may instead be connected to a row of LED modules, a group of rows of LED modules, or to any module 10 in a line or sequence of modules 10.

In one embodiment, two transceivers 12 are positioned on a single module 10. One transceiver 12 transmits data to an adjacent LED module 10 and the other transceiver 12 receives data from an adjacent module 10. FIGS. 11-13 show a module 10 having four transceivers 12. Using four transceivers increases the versatility of communication paths among the various modules 10.

It should further be appreciated that this embodiment may be used with or without contact plates 48 for distributing power. As the modules 10 of this embodiment receive signals directly from controllers 52, there is no need for a hard-wired data transmission line 42 to provide data to the modules 10. However, power is still required. Power may be distributed through buses 36, 34 as shown in FIG. 3 or through power contact points 20, 26 in connection with contact plates 48 shown in FIGS. 4 and 5.

In a further embodiment, an LED module 10 may use both the data transmission system of FIGS. 8 and 9, including a contact plate 48 with data contact pads 50 and the short range transceivers 12.

This embodiment uses the contact plate 48 shown in FIGS. 8 and 9. As discussed above, this contact plate 48 has both a data transmission line 42 and data contact pads 50, in addition to the power contact pads 44, 46 and power transmission lines 38, 40.

Figure 15B:
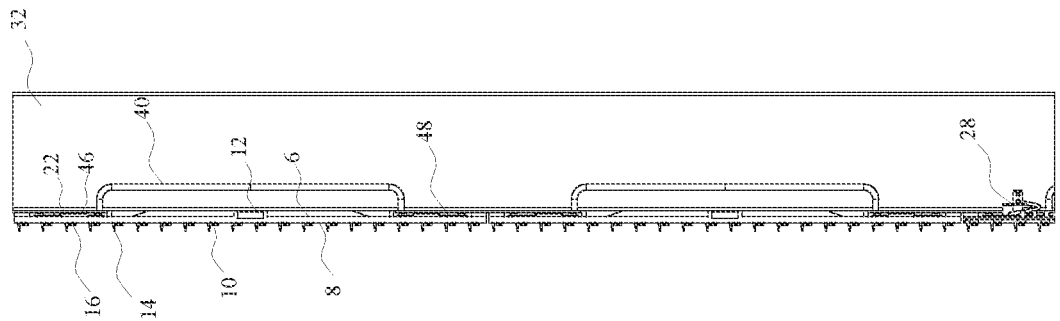
FIG. 15B is a cross section taken at cross section A-A of FIG. 15A.
Figure 15A:
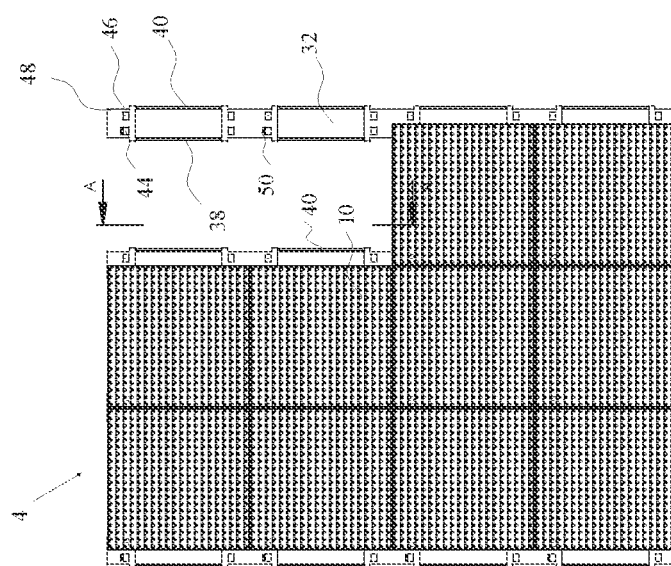
FIG. 15A is a front view of an LED display having two panels missing and showing contact plates.

As shown in FIGS. 15A-15B, the array 4 includes the contact plates 48 having both power 44, 46 and data contact pads 50. Further, the transceivers 12 between modules 10 are shown in the cross section along line A-A.

In this embodiment, the LED modules 10 incorporate the structure of both the data contact points 18 and the short-range transceivers 12. The structure of these features is the same as the previous embodiments.

The operation of this embodiment may vary depending on the desired performance. In some applications, this embodiment may be used to ease installation and increase longevity of the display 4. Specifically, the short-range transceivers 12 may be used to locate each module 10 within the display array 4 such that this information is not required to be input when programming the modules 10 for operation. Once the data is determined, the short-range transceivers 12 may then be shut off such that the module 10 only receives signal through the data contact points 18. In the event that a data contact point 18 fails, the module 10 may swap to using the short-range transceivers 12 to provide data to the defective module 10. This method of operation would not require using a controller 52 to provide data to the modules 10 as the previous module 10 receives the signal directly from the data bus 42. As the modules 10 are able to locate themselves within the array 4, the modules 10 are able to provide the necessary information to surrounding modules 10 through the use of the short-range transceivers 12. Thus, this embodiment increases the longevity and ease of installation of the system by providing the benefits of both systems along with additional failure prevention methods.

While various embodiments of the system have been described in detail, it is apparent that modifications and alterations of those embodiments will occur to those skilled in the art following review of the present disclosure. It is to be expressly understood that such modifications and alterations are within the scope and spirit of the present disclosure.

What is claimed is:

1. A light-emitting diode (LED) display, comprising:
   a display support structure;
   a plurality of LED modules, each module of the plurality of modules comprising:
      a printed circuit board containing a plurality of LEDs;
      a front face including a plurality of openings, each opening configured to provide visual access to one or more LEDs;
      a rear face including at least a first and a second conductive contact;

at least one locking mechanism configured to secure the module to the support structure;
a first positive bus and a second negative bus positioned exterior to the plurality of LED modules and configured to distribute power to the plurality of LED modules;
wherein, securing each of the plurality of LED modules to the support structure by the at least one locking mechanism causes the at least first conductive contact to contact and electrically connect to the first positive bus and the second conductive contact to contact and electrically connect to the second negative bus and power is distributed to each of the plurality of LED modules without a power cable.

2. The LED display of claim 1, further comprising at least a first and a second compressible seal affixed to the rear face of each of the plurality of LED modules, wherein the first seal surrounds the first conductive contact and the second seal surrounds the second conductive contact.

3. The LED display of claim 2, wherein engaging the at least one locking mechanism to secure each LED module of the plurality of LED modules causes the first and second compressible seals to be compressed and form a weather resistant seal around the first and second conductive contacts.

4. The LED display of claim 1, wherein the at least first and second conductive contacts are outwardly biased to extend beyond the rear face of the LED module.

5. The LED display of claim 1, wherein each LED module of the plurality of LED modules further comprises a third and a fourth conductive contact disposed on the rear face, and wherein the at least one locking mechanism comprises four locking mechanisms with a different one of the locking mechanisms positioned proximate each of the four conductive contacts.

6. The LED display of claim 5, wherein the four locking mechanisms are each positioned medially relative to the associated conductive contact.

7. The LED display of claim 1, further comprising at least one heat dissipating fin extending from the rear face of each of the plurality of LED modules.

8. The LED display of claim 1, further comprising an outwardly extending louver positioned proximate each of the plurality of openings.

9. The LED display of claim 1, further comprising an outwardly extending handle positioned on the rear surface of each of the plurality of LED modules.

10. The LED display of claim 1, wherein at least one of the first positive bus and the second negative bus distribute data by modulated power distribution.

11. A light-emitting diode (LED) display, comprising:
a display support structure;
a plurality of LED modules, each module of the plurality of modules comprising:
    a printed circuit board containing a plurality of LEDs;
    a rear face including at least a first and a second conductive contact;
    at least one attachment mechanism configured to secure the module to the support structure;
a first bus and a second bus configured to at least distribute power to the plurality of LED modules;
a plurality of contact plates connected to the support structure, each of the plurality of contact plates having at least a first and second contact pad wherein the first contact pad is conductively connected to the first bus and the second contact pad is conductively connected to the second bus; and
wherein, attaching the plurality of LED modules to the support structure causes the first conductive contact of each one of the plurality of LED modules to contact and conductively connect to one of the first contact pads of one of the plurality of contact plates and the second conductive contact of each of the plurality of LED modules to contact and conductively contact the second contact pad of the one of the plurality of contact plates and power is distributed to each of the plurality of LED modules.

12. The LED display of claim 11, further comprising a data bus positioned exterior to the plurality of LED modules and at least one data contact located on the rear face of the module, wherein attaching each of the plurality of LED modules to the support structure causes the at least one conductive data contact to conductively connect to the data bus.

13. The LED display of claim 11, further comprising:
a data contact located on the rear face of each of the plurality of LED modules proximal one of either the at least a first conductive contact and the second conductive contact; and
a data contact pad located on each of the plurality of contact plates;
wherein attaching each of the plurality of LED modules to the support structure causes the data contact to contact and conductively connect to the data contact pad of one of the plurality of contact plates.

14. The LED display of claim 13, further comprising:
a third conductive contact and a fourth conductive contact on the rear face of each of the LED modules;
a third contact pad and a fourth contact pad on each of the plurality of contact plates;
wherein, attaching each of the plurality of LED modules to the support structure causes the third conductive contact of each one of the plurality of LED modules to contact and conductively connect to the third contact pad of one of the plurality of contact plates and the fourth conductive contact of each of the plurality of LED modules to contact and conductively connect to the fourth conductive contact of the one of the plurality of contact plates.

15. The LED display of claim 13, wherein the data contact pad located on each of the contact plates comprises a first data contact pad, a second data contact pad and a third data contact pad; the data contact on each of the LED modules comprises a first data contact, a second data contact, and a third data contact; and the first contact pad and first data contact form a positive connection, the second contact pad and second data contact form a negative connection and the third contact pad and third data contact form a ground connection.

16. The LED display of claim 11, further comprising a compressible seal surrounding each of the conductive contacts of the LED module that forms a weatherproof seal upon attaching the LED module to the support structure.

17. The LED display of claim 11, wherein more than one LED module is connected to and receives power via a single contact plate.

18. A light-emitting diode (LED) display, comprising:
a display support structure;
a plurality of LED modules, each module of the plurality of modules comprising:
    a printed circuit board containing a plurality of LEDs;
    a rear face including at least a first and a second conductive contact;

at least one attachment mechanism configured to secure the module to the support structure;

a first bus and a second bus configured to at least distribute power to the plurality of LED modules;

wherein, attaching a first one of the plurality of LED modules to the support structure by the at least one attachment mechanism of the first one of the plurality of LED modules causes the first conductive contact of the first one of the plurality of LED modules to contact directly and conductively connect to the first bus first and the second conductive contact of the first one of the plurality of LED modules to contact directly and conductively connect to the second bus; and wherein, attaching a second one of the plurality of LED modules to the support structure by the at least one attachment mechanism of the second one of the plurality of LED modules causes the first conductive contact of the second one of the plurality of LED modules to contact directly and conductively connect to the first bus and the second conductive contact of the second one of the plurality of LED modules to contact directly and conductively connect to the second bus.

19. The LED display of claim 18, wherein at least one of the first bus and the second bus distribute data by modulated power distribution.

* * * * *